United States Patent
Blake (10) Patent No.: US 6,307,632 B1
(45) Date of Patent: Oct. 23, 2001

(54) MAGNETIC FIELD INTEGRATED FIBER OPTIC SENSOR WITH IMPROVED SENSITIVITY

(75) Inventor: James N. Blake, Scottsdale, AZ (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 09/275,491

(22) Filed: Mar. 24, 1999

(51) Int. Cl.[7] .................................................. G01B 9/02
(52) U.S. Cl. ....................................... 356/477; 356/483
(58) Field of Search ..................................... 356/345, 350; 250/227.14, 227.19, 227.27; 385/12, 14

(56) References Cited

U.S. PATENT DOCUMENTS

| | | |
|---|---|---|
| 3,605,013 | 9/1971 | Yoshikawa . |
| 3,707,321 | 12/1972 | Jaecklin et al. . |
| 3,746,983 | 7/1973 | Renz . |
| 4,255,018 | 3/1981 | Ulrich et al. . |
| 4,372,685 | 2/1983 | Ulrich . |

(List continued on next page.)

FOREIGN PATENT DOCUMENTS

| | | |
|---|---|---|
| 671 638 A5 | 9/1989 | (CH) . |
| 28 35 794 A1 | 2/1980 | (DE) . |
| 195 17 128 A1 | 11/1996 | (DE) . |
| 0 612 981 A1 | 8/1994 | (EP) . |
| 2 190 744 | 11/1987 | (GB) . |

OTHER PUBLICATIONS

Short et al., "Elimination of Birefringence Induced Scale Factor Errors in the In–Line Sagnac Interferometer Current Sensor", *Journal of Lightwave Technology*, vol. 16 No. 10 pp. 1844–1850 (Oct. 1998).

J. Blake, "In Line Sagnac Interferometer Current Sensor," 1995 IEEE Transactions on Power Delivery, vol. 11, No. 1, Jan. 1996.

Yu et al., "Magnet–sensitive Optical Fiber and its Application in Current Sensor System," Database accession No. 4250392 XP002131302 abstract & Fiber Optic and Laser Sensors IX, Bottom, MA, USA, Sep. 3–5, 1991, vol. 1584, pp. 135–137, Proceedings of the SPIE—The International Society for Optical Engineering, 1991, US ISSN: 0277–786X.

(List continued on next page.)

Primary Examiner—Samuel A. Turner
(74) Attorney, Agent, or Firm—Baker Botts L.L.P.

(57) ABSTRACT

A current sensor coil design for reducing or eliminating long undulations of magnetic sensitivity. Such reduction or elimination improves isolation of the current sensor such that proximate currents and accompanying effects do not affect the accuracy of the current sensor determination of a current being measured. Several designs, which may be incorporated separately or in combination, include modifying the specifications of the quarter waveplate, cutting the fiber of the sensor coil to a proper length, choosing a proper perimeter length of the sensor coil or head, and using a particular length of fiber adjusted to work in conjunction with a multi-wavelength or broadband light source.

32 Claims, 4 Drawing Sheets

U.S. PATENT DOCUMENTS

| | | |
|---|---|---|
| 4,456,376 | 6/1984 | Carrington et al. . |
| 4,545,682 | 10/1985 | Greenwood . |
| 4,578,639 | 3/1986 | Miller . |
| 4,613,811 | 9/1986 | Vaerewyck et al. . |
| 4,615,582 | 10/1986 | Lefevre et al. . |
| 4,733,938 | 3/1988 | Lefevre et al. . |
| 4,779,975 | 10/1988 | Kim . |
| 4,894,608 | 1/1990 | Ulmer, Jr. . |
| 4,947,107 | 8/1990 | Doerfler et al. . |
| 4,973,899 | 11/1990 | Jones et al. . |
| 5,034,679 | 7/1991 | Henderson et al. . |
| 5,051,577 | 9/1991 | Lutz et al. . |
| 5,056,885 | 10/1991 | Chinn . |
| 5,063,290 | 11/1991 | Kersey . |
| 5,133,600 | 7/1992 | Schroder . |
| 5,157,461 | 10/1992 | Page . |
| 5,181,078 | 1/1993 | Lefevre et al. . |
| 5,270,791 | 12/1993 | Lefevre et al. . |
| 5,297,436 | 3/1994 | Chan et al. . |
| 5,400,418 | 3/1995 | Pearson et al. . |
| 5,434,501 | 7/1995 | Esman et al. . |
| 5,455,676 | 10/1995 | Nishiura et al. . |
| 5,463,312 | 10/1995 | Lutz et al. . |
| 5,479,094 | 12/1995 | Esman et al. . |
| 5,553,173 | 9/1996 | Lutz et al. . |
| 5,587,791 | 12/1996 | Belleville et al. . |
| 5,598,489 | 1/1997 | Pavlath et al. . |
| 5,644,397 * | 7/1997 | Blake ................................. 356/345 |
| 5,677,622 | 10/1997 | Clarke . |
| 5,696,858 * | 12/1997 | Blake ................................. 385/12 |
| 5,729,005 | 3/1998 | MacDougall et al. . |
| 5,732,167 | 3/1998 | Ishiko et al. . |
| 5,780,847 | 7/1998 | Dawson et al. . |
| 5,978,084 | 11/1999 | Blake . |
| 5,987,195 | 11/1999 | Blake . |
| 5,999,668 | 12/1999 | Hernandez et al. . |
| 6,023,331 | 2/2000 | Blake et al. . |

OTHER PUBLICATIONS

J. R. Qian, "Spun Linear Birefringence Fibres and Their Sensing Mechanism in Current Sensors with Temperature Compensation," IEE Proceedings Optoelectronics 141 (1994) Dec., No. 6, pp. 373–380, Stevenage, Herts., GB.

F. Maystre, "Magneto–optic Current Sensor Using a Helical Fiber Fabry–Perot Resonator," Springer Proceedings in Physics, vol. 44, pp. 267–272.

J. N. Ross, "The Rotation of the Polarization in Low Birefringence Monomode Optical Fibres Due to Geometric Effects," Optical and Quantum Electronics 16 (1984), pp. 455–461.

Frosio, "Reciprocal Reflection Interferometer for a Fiber–Optic Faraday Current Sensor," Applied Optics, Sep. 1, 1994, vol. 33, No. 25, pp. 6111–6122.

Oho, "Time–Domain Sagnac Phase Reading in Open–Loop Fiber Optic Gyroscopes," IEICE Trans Electron, vol. E79 C. No. 11, pp. 1596–1601, (Nov. 1996).

Deeter., "Fiber–optic Faraday–effect Magnetic–field Sensor Based on Flux Concentrators," Applied Optics, vol. 35, No. 1, Jan. 1, 1996.

I. M. Bassett, "Design Principle for a Circularly Birefringent Optical Fiber," Optics Letters, vol. 13, No. 10, Oct. 1988, pp. 844–846.

Clarke, "Temperature–Stable Spun Elliptical–Core Optical–Fiber Current Transducer," Optics Letters, vol. 18, No. 2, Jan. 15, 1993, pp. 158–160.

Laming, "Electric Current Sensors Employing Spun Highly Birefringent Optical Fibers," Journal of Lightwave Technology, vol. 7, No. 12, Dec. 1989, pp. 2084–2094.

Kamada, "Fiber–Optical Current Sensors Using Mixed Rare–Earth Iron Garnet Cystals," Proceedings of the 3rd Sensor Symposium, 1983, pp. 167–169.

de Carvalho, "Sagnac Interferometers for Accurate Measurements of True Nonreciprocal Effects", SPIE, vol. 2070, pp. 264–269.

Rochford, "Polarization Dependence of Response Functions in 3x3 Sagnac Optical Fiber Current Sensors", Journal of Lightwave Technology, vol. 12, No. 8, Aug. 1994, pp. 1504–1509..

Nicati, "Stabilised Current Sensor Using Sagnac Interferometer", IOP Publishing Ltd., 1988, pp. 791–796.

H. Taylor, "Fiber Sensors: 2", U.S. Naval Research Laboratory, Apr. 29, 1981, pp. 128–130.

P.A. Nicati, "Stabilized Sagnac Optical Fiber Current Sensor Using One Phase and Two Amplitude Modulations", Swiss Federal Institute of Technology of Lausanne, pp. 402–405.

I.G. Clarke, "A Current Sensor Using Spun Birefringent Fibre in a Sagnac Configuration", OFTC, University of Sydney, Australia, pp. 167–170.

A. Yu, "A Theoretical and Experimental Investigation of a Practicable Fibre Optic Current Sensor Using Sagnac Interferometer", Department of Electronic Systems Engineering, University of Essex, pp. 289–292.

L.R. Veeser, "Faraday Effect Current Sensing Using a Sagnac Interferometer With a 3x3 Coupler", National Institute of Standards and Technology, pp. 325–328.

Leilabady, "A Pseudo–Reciprocal Fibre–Optic Faraday Rotation Sensor: Current Measurement and Data Communication Applications", Elsevier Science Publishers B.V., pp. 173–176.

R.A. Bergh, "Geometrical Fiber Configuration for Isolators and Magnetometers", Fiber–Optic Rotation Sensors and Related Technologies, Springer Series in Optical Sciences 32, 1982, pp. 111–116.

de Carvalho, "Simultaneous Measurement of Electric and Magnetic Fields Using a Sagnac Interferometer", Texas A&M University, College Station, Texas.

S.X. Short, et al., "Imperfect quarter–waveplate compensation in Sagnac Interferometer type current sensors," Journal of Lightwave Technology, Conference Proceedings, Oct. 27, 1997.

* cited by examiner

MAGNETIC FIELD INTEGRATED FIBER OPTIC SENSOR WITH IMPROVED SENSITIVITY

BACKGROUND

The invention pertains to current sensors and particularly to fiber optic current sensors. More particularly, the invention pertains to fiber optic current sensors having improved isolation.

Fiber optic current sensors operate on the principle that the magnetic field produced by an electrical current affects certain properties of the light contained in an optical fiber wound around the current carrying conductor. Through the Faraday effect, those properties affected can be either the polarization state of the light (polarimetric type sensor) or the velocity of the light (interferometric type sensor). Through Ampere's law, $$\oint H \cdot dl = I, \tag{1}$$

it is evident that for the current sensor to make an accurate determination of the current, I, the light in the fiber should be uniformly and linearly sensitive to the magnetic field, H, and the sensitive region should comprise as perfectly a closed path as possible. In this case, the sensor substantially measures $\oint H \cdot dl$, thereby giving an indication of I as an output, provided that the sensor is well isolated against currents flowing outside the sensing loop. In addition, the sensor should return the correct value of I regardless of the actual location of the current flowing through the sensing coil.

Figure 5:
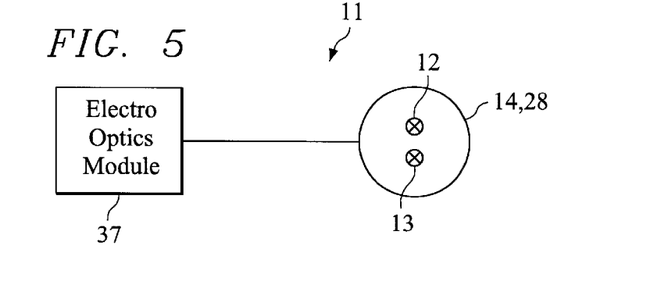
FIG. 5 shows a fiber optic current sensor for measuring small differences between two large currents.

A number of applications for current sensing exist which require the sensor to exhibit an extremely good isolation from external currents as well as extremely uniform response to currents that pass through the sensing coil at different physical locations. For example, a ground fault interrupter for large currents may have a difference current measurement system 11 with a sensor coil or head 14 that encloses both the outgoing 12 and return 13 currents (FIG. 5). Hundreds of amperes of current may flow through the wires, while a difference between the two currents 12 and 13 of a few milliamperes should be quickly recognized. Such a system may exist in the vicinity of many other conductors carrying hundreds of amperes of current. The isolation of sensor head 14 to external currents should therefore be better than ten parts-per-million, and sensor system 11 should respond uniformly to the outgoing and return currents to within ten parts-per-million.

Figure 7:
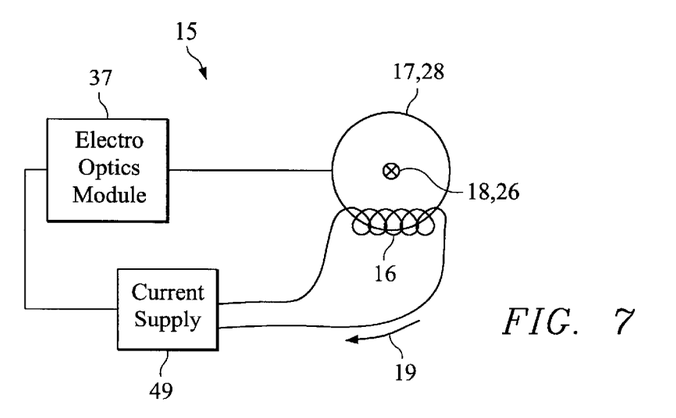
FIG. 7 shows a fiber optic current sensor assisted current transformer.

A second example of how a fiber optic current sensor may advantageously benefit from good isolation/uniformity performance is the construction of a fiber optic current sensor 15 assisted current transformer 16 (FIG. 7). In this device, fiber optic current sensor 15 is operated using a secondary current 19 from current supply 49 to null the output (i.e., close the loop). A current 18 to be measured passes through a sensing coil or head 17, while an equal and opposite loop closing current 19 passes through the sensing coil 16, possibly through multiple turns. Loop closing current 19 includes the secondary of this fiber optic current sensor 15 assisted current transformer. The accuracy of this device depends on current sensor 15 exhibiting uniform response to currents passing therethrough for all the different physical locations of current 18.

Figure 6:
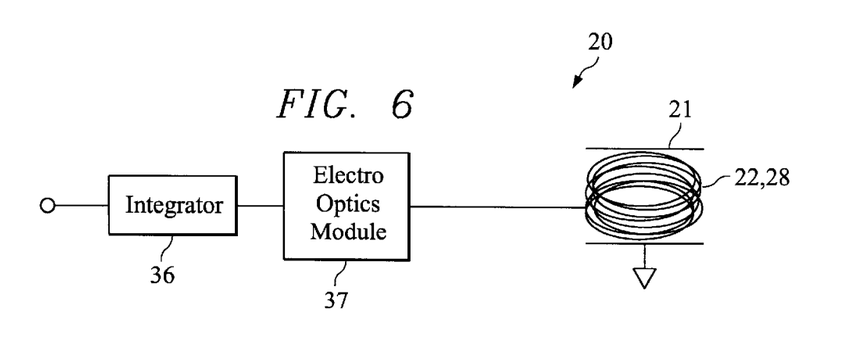
FIG. 6 shows a displacement current-based voltage sensor.

A third example of a fiber optic current sensor requiring superior isolation is the displacement current based voltage sensor 20 (FIG. 6). In this device, an AC voltage 21 is measured by integrating (by integrator 36 via electro-optics module 37) the output of a current sensor head 22 that responds to displacement current. Typically, sensor 20 might measure a few milliamperes of displacement current. The power line, which carries voltage 21 to be measured, may also carry a real current, which might typically be a few thousand amperes. Thus, to obtain a true measure of the voltage, it is necessary for the current sensor head 22 to be well isolated from the real current flowing through the power line. The isolation requirement for this application may easily exceed one part-per-million.

A problem with Faraday effect based optical current sensors, both polarimetric 23 (FIG. 2) and interferometric 24, 25 (FIGS. 3 and 4), is that the sensitivity of the light to the local magnetic field depends on the exact polarization state of the light at that point. It is very difficult to maintain a strictly uniform state of polarization of the light throughout a sensing path of the sensing head or coil, as stresses within the glass induce local birefringences that alter the polarization state of the light. Thus, a method of desensitizing the sensor head to these imperfections is needed in order to achieve the overall intended isolation and uniformity requirements.

SUMMARY OF THE INVENTION

It has been discovered that maintaining an unaltered polarization state of the light throughout the sensing loop(s) is not a practical necessity to achieve superior isolation and uniformity performance of the sensor. Rather, a sufficient requirement on the sensor head or coil for achieving good isolation and uniformity is that it not exhibit long period undulations in sensitivity. Undulations having long periods reduce isolation of the sensor head so as to be sensitive to other currents not intended to be measured. Accordingly, set forth here are design approaches for fiber optic current sensors that reduce long period undulations in the sensitivity of the sensing head coil. Remaining rapid undulations contribute negligibly to uniformity and isolation errors.

DESCRIPTION OF THE PREFERRED EMBODIMENT

Figure 1:
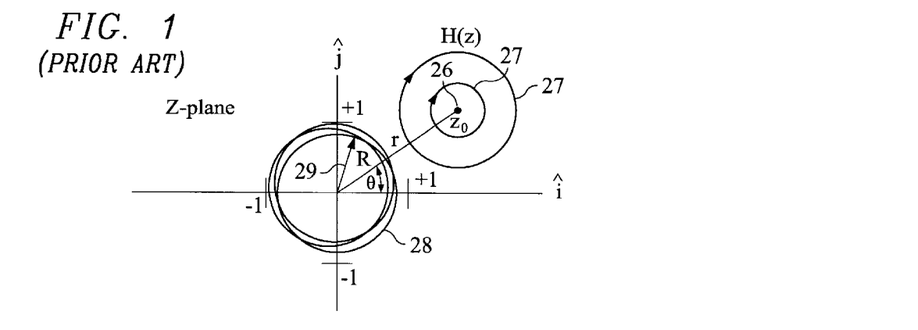
FIG. 1 shows the geometry of an electrical current, its associated magnetic field, and an optical current sensor coil.

For a complex plane Z, vector notation is z=ix+jy and scalar notation is z=x+iy). Vector quantities are typed in boldface. As shown in FIG. 1, a current 26, I, flows perpendicular into the complex plane Z in the k direction at coordinate position $z_0$. The magnetic field 27, H, at position z associated with flowing current 26 is given by, $$H = \frac{I}{2\pi} \frac{k \times (z - z_0)}{|z - z_0|^2} \qquad (2)$$

$$= \frac{I}{2\pi |z - z_0|^2} \{-i(y - y_0) + j(x - x_0)\}$$

A fiber current sensor head 28 measures $$I_{sensed} = \oint S(z) H \cdot dz, \qquad (3)$$

where $S(z)$ is the relative sensitivity of sensor head 28 at position z. Ideally, $S(z)=1$ for all z, i.e., sensor head 28 uniformly responds to magnetic field 27 all along its sensing path. Substituting equation (1) into equation (2) one finds that $$I_{sensed} = \frac{I}{2\pi} \oint \frac{S(z)}{|z - z_0|^2} \{-(y - y_0) dx + (x - x_0) dy. \qquad (4)$$

Using the relations $$x - x_0 = \frac{1}{2}(z - z_0 + z* - z_0*); \, dx = \frac{1}{2}(dz + dz*) \qquad (5)$$

and $$y - y_0 = \frac{1}{2i}(z - z_0 + z* - z_0*); \, dy = \frac{1}{2}(dz + dz*), \qquad (6)$$

equation (4) is found to be $$I_{sensed} = Re\left[\frac{I}{2\pi i}\oint \frac{Re[S(z)]}{z - z_0} dz\right] - \frac{I}{2\pi i}Im\left[\oint \frac{Im[S(z)]}{z - z_0} dz\right]. \qquad (7)$$

For all real problems, $Im[S(z)]$ must vanish along the path of integration, since the sensitivity must ultimately be a real valued function along the sensing fiber (though it need not be real valued elsewhere). Consequently, the second integral in equation (7) is zero, and $Re[S(z)]$ can be replaced by $S(z)$ in the first integral. Thus, one has the general result that for real sensor heads, $$I_{sensed} = Re\left[\frac{I}{2\pi i}\oint \frac{Re[S(z)]}{z - z_0} dz\right]. \qquad (8)$$

From equation (8), one can see that current 26 at position $z_0$ creates a single pole at that point. This corresponds to the physical pole in magnetic field 27 associated with the assumed infinitely thin current flow. For the ideal case that $S(z)=1$, equation (8) is solved using the residue theorem to yield $I_{sensed}=I$ when the path of integration encloses current 26 (i.e., the path integral encloses the pole at $z_0$), and $I_{sensed}=0$ when the path of integration does not enclose current 26.

For mathematical simplicity, one now makes the assumption that fiber sensor head 28 lies on the unit circle in the complex plane. Thus, sensor head 28 encloses current 26 carrying wire if $|z_0|<1$, and sensor head 28 does not enclose current 26 if $|z_0|>1$. The results that follow from this assumption apply exactly to the case of a fiber current sensor with a circular sensing head; however, the principles derived apply also to the case of a "non-circular" sensing head. For example, one could have a square or oval winding as part of sensor head 28. The isolation and uniformity imperfections derived apply to all types of optical current sensors that operate by integrating the magnetic field.

Figure 2:
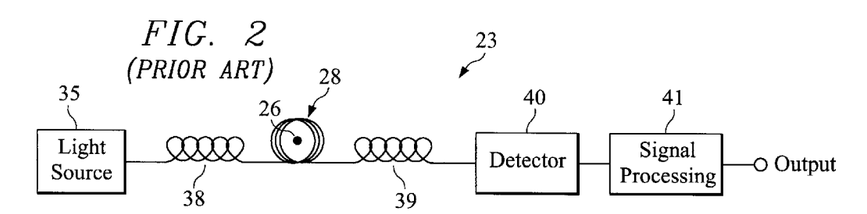
FIG. 2 shows a polarimetric fiber optic current sensor.
Figure 3:
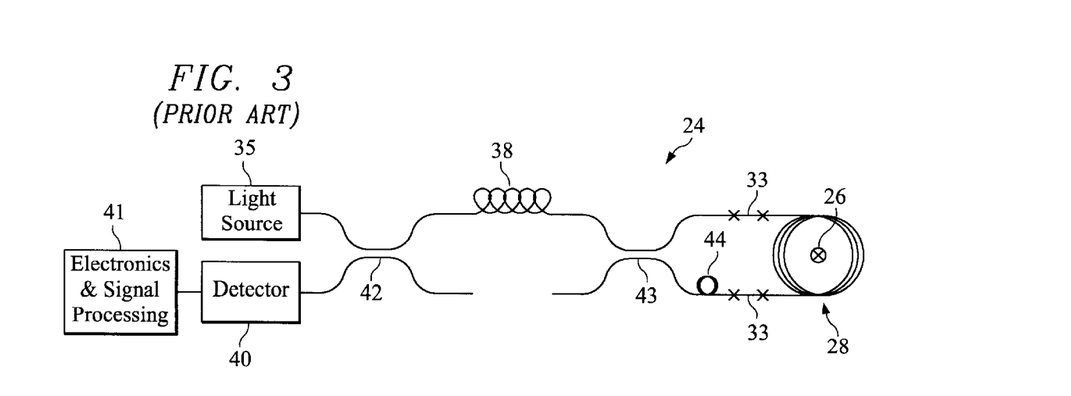
FIG. 3 shows a Sagnac loop type fiber optic current sensor.
Figure 4:
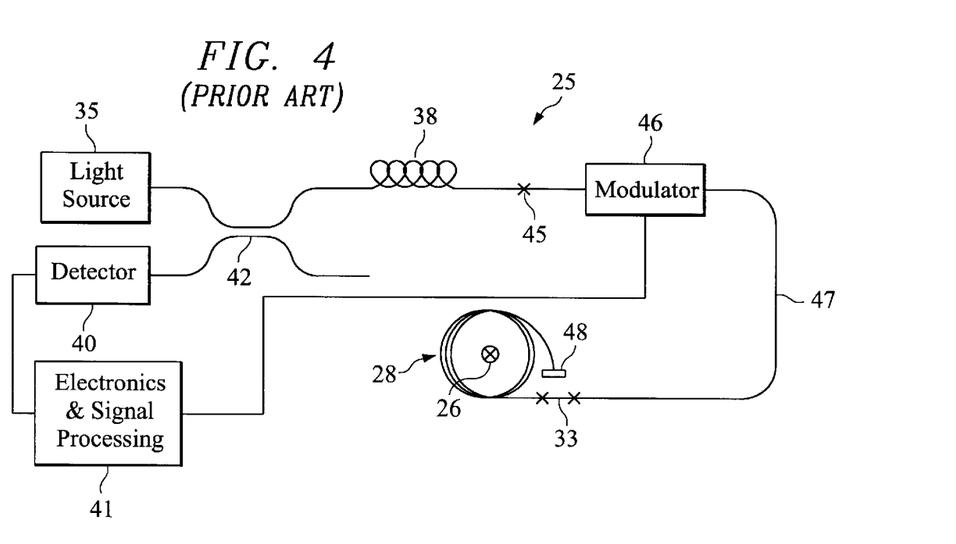
FIG. 4 shows an in-line interferometric type fiber optic current sensor.

Particular implementations of fiber optic current sensors include a polarimetric current sensor 23 in FIG. 2, a Sagnac loop current sensor 24 in FIG. 3, and an in-line interferometric current sensor 25 in FIG. 4.

In sensor 23, source 35 outputs light that goes through polarizer 38, the optical fiber coil of sensor head 28, and analyzer 39. Magnetic field 27 of current 26 affects the polarization of the light. This change is noted by detector 40. The output of detector 40 goes to electronics and signal processor 41.

In sensor 24, source 35 outputs light through coupler 42 and polarizer 38. The light is split by coupler 43 into counterpropagating beams for sensor head 28. The light beams go through quarter waveplates, for conversion to circular polarization and vice versa upon their return to coupler 43. A bias modulation signal from electronics 41 applied to the light by modulator 44. The returning beams go through coupler 43 and polarizer 38 to detector 40. Magnetic field 27 of current 26 affects a phase relationship which is noted at detector 40. The electrical output of detector 40 goes to electronics and signal processor 41.

In sensor 25, source 35 outputs light through coupler 42, polarizer 38 and 45-degree splice 45 to modulator 46. The output light of modulator 46 goes through fiber delay line 47 and quarter waveplate 33 to an optical fiber coil of sensor head 28. The light is reflected back by mirror 48 back through the fiber coil of sensor head 28, quarter waveplate polarization converter 33 and delay line 47 to modulator 46. The light going back from modulator 46 goes through splice 45, polarizer 38 and coupler 42 to detector 40. Magnetic field 27 of current 26 affects the phase relationship of the entering light and returning light of sensor head 28, which is noted at detector 40. The electrical output from detector 40 goes to electronics and processor 41.

This technology is related to the in-line optical fiber current sensor as disclosed in U.S. Pat. No. 5,644,397 issued Jul. 1, 1997, to inventor James N. Blake and entitled "Fiber Optic Interferometric Circuit and Magnetic Field Sensor", which is incorporated herein by reference. Optical fiber sensors are also disclosed in U.S. Pat. No. 5,696,858 issued Dec. 9, 1997, to inventor James N. Blake and entitled, "Fiber Optics Apparatus and Method for Accurate Current Sensing", which is incorporated herein by reference.

The Fourier components of the sensitivity function $S(\theta)$ in polar coordinates on the unit circle are $e^{in\theta}$ or $e^{-in\theta}$ where n is an integer. The corresponding Fourier component representations in the complex Z plane are $z^n$ and $z^{-n}$.

The sensitivity function of a ring fiber sensor head 28 can be represented in polar coordinates as $$S(\theta) = S_0 + \sum_{n=1} a_n e^{in\theta} + b_n e^{-in\theta} \qquad (9)$$

or generalized in the Z plane as $$S(z) = S_0 + \sum_{n=1} a_n z^n + b_n z^{-n}. \qquad (10)$$

In these equations, one restricts the choices of $a_n$ and $b_n$ to satisfy the condition that $S(z)$ is real valued on the unit circle of sensor head 28. Substituting equation (10) into equation (8) and solving the integral using the residue theorem yields the general relationship between the sensed current and the real current. The results are $$I_{sensed} = I\left[S_0 + Re\left(\sum_{n=1}^{\infty} a_n z_0^n\right)\right] \text{ for } |z_0| < 1 \quad (11)$$

and $$I_{sensed} = -IRe\left(\sum_{n=1}^{\infty} b_n z_0^{-n}\right) \text{ for } |z_0| > 1. \quad (12)$$

Equation (11) represents the scale factor, or uniformity error associated with the current 26 being offset from the middle of fiber sensing coil 28, and equation (12) represents the isolation of the sensor to currents 26 passing outside sensing coil 28.

A particularly important example to solve is that where the sensitivity function is given by $S(\theta)=1+\epsilon\cos(n\theta)$. As will be shown later, for the case that a sensing fiber 30 of sensor head 28 comprises a periodic structure, a long period undulation in the sensitivity of the fiber to magnetic fields exists. These long undulations ultimately limit the uniformity and isolation performance of the sensor.

The radius of sensing fiber coil 28 is taken to be R, and the current 26 carrying wire is taken to be located at the point $(r, \phi)$ in polar coordinates. By solving equations (9) through (12), one finds the uniformity error due to a non-centered current to be given by $$\frac{I_{sensed}}{I} - 1 = \frac{\varepsilon}{2}\left(\frac{r}{R}\right)^n \cos(n\phi) \quad R > r, \quad (13)$$

while the isolation to currents outside sensing fiber loop 28 is given by $$\frac{I_{sensed}}{I} = \frac{-\varepsilon}{2}\left(\frac{R}{r}\right)^n \cos(n\phi) \quad r > R. \quad (14)$$

From these results one sees that higher order variations in the sensitivity of fiber sensor head 28 (corresponding to high values of n) contribute negligibly small uniformity errors for nearly centered currents and negligibly small isolation errors for nearby current carrying wires any reasonable distance from the fiber sensor. However, long period undulations in the sensitivity (corresponding to low values of n) give rise to significant errors and should be avoided in the optical design of the sensor head.

Both the Sagnac loop 24 and in-line interferometric 25 type current sensors operate on the principle that at circularly polarized light waves propagate with different velocities in the presence of a magnetic field 27. Thus, for these types of sensor implementations, one desires to launch and maintain circularly polarized light waves in the sensing fiber. One method for maintaining circularly polarized light waves in an optical fiber is to construct a fiber 30 using a periodic structure 31 (illustrated in FIG. 8) with appropriate properties.

Figure 8:
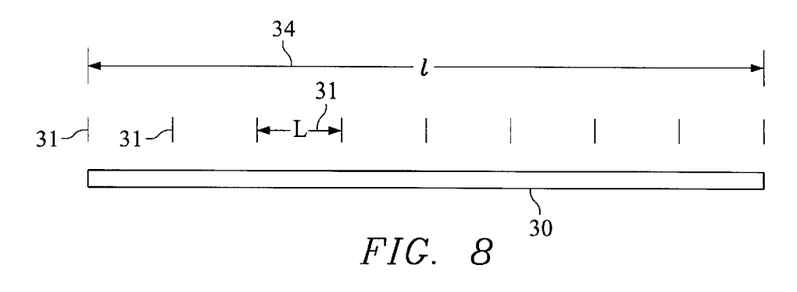
FIG. 8 shows a depiction of an optical fiber having a periodic structure used for making a fiber optic current sensing coil.

Sensing fiber 30 having a periodic structure 31 with lengths L may be modeled using a Jones matrix $$\begin{pmatrix} A & B \\ -B* & A* \end{pmatrix}$$

to represent each period of the periodic structure. The associated eigenvalues, $\lambda_{\pm}$, for this matrix are given by $$\lambda_{\pm} = e^{\pm j\arccos[Re(A)]} \quad (15)$$

and the associated eigenvectors, $v_{\pm}$, are given by $$v_{\pm} = \begin{pmatrix} B \\ \lambda_{\pm} - A \end{pmatrix}. \quad (16)$$

Appropriate periodic structures for maintaining circular polarization are those for which $v_{\pm}$ approximate right- and left-handed circular polarization states.

Figure 9:
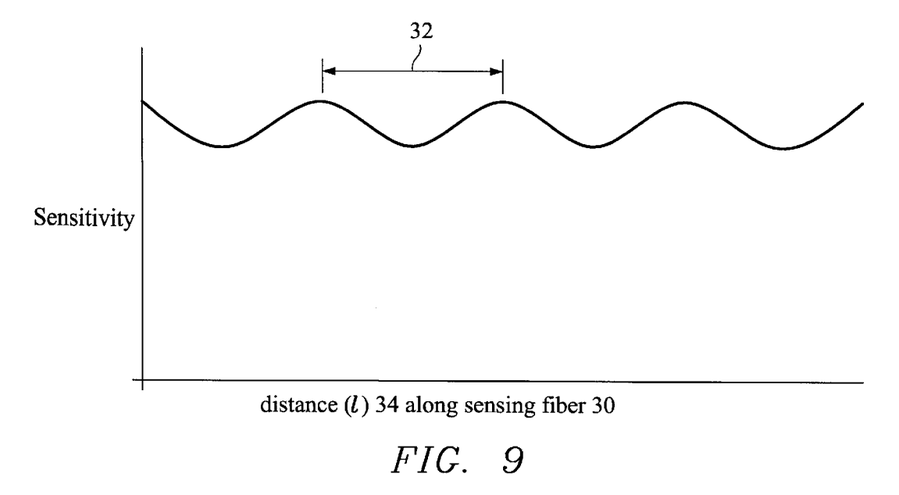
FIG. 9 shows the sensitivity of a fiber optic current sensing coil as a function of distance along the sensing fiber.

When light is launched into such a fiber 30, the polarization state of the light will evolve with both rapid undulations (spatial harmonics of the period of the periodic structure) and a slow undulation (having a period much longer than the period of the periodic structure). FIG. 9 illustrates the fiber sensitivity having a long period undulation 32. As shown above, the rapid undulations contribute negligibly to uniformity and isolation errors. Thus, the slow period 32 poses the biggest concern. For this fiber 30, the slow period of polarization state evolution, $\xi$, is given by $$\xi = L\frac{\pi}{\cos^{-1}[Re(A)]}. \quad (17)$$

Here L is the length 31 of each period of the periodic structure.

For the case that sensing fiber 30 with a periodic structure comprises a bent-spun birefringent fiber, the long spatial period that exists has been found to be $$\xi \approx 4L_B^2/L_{rev}. \quad (18)$$

Here $L_B$ is the intrinsic polarization beat length of the fiber in its unspun state, and $L_{rev}$ is the distance over which the fiber is twisted by one revolution. $L_{rev}$ is the length 31 of each period in the periodic structure of fiber 30. The long spatial period, $\xi$, is independent of the bend radius as long as fiber 30 is not bent too severely. For a highly bent spun fiber, $\xi$ becomes shorter. The amplitude of this low frequency deviation of the polarization away from circular polarization increases with increasing bend birefringence (due to tighter bending). As a numerical example, a fiber 30 having an unspun beat length of $L_B$=3 centimeters (cm), and a spin rate of $L_{rev}$=5 millimeters (mm) will exhibit a periodic variation in sensitivity to magnetic fields with a period of approximately 72 cm.

As the light propagates down the fiber, the light oscillates in and out of the pure circular polarization state. For minimizing the power that leaves the desired circular state of polarization, it is important to optimize the ratio of the spin rate to the intrinsic polarization beat length of the fiber. If the spin rate is too fast, the intrinsic birefringence of the fiber is too well averaged and the fiber becomes very sensitive to bend induced birefringence. If the spin rate is too slow, the intrinsic birefringence is not well averaged, and the fiber does not hold a circular state of polarization for this reason. Numerical modeling of the characteristics of a bent spun birefringent fiber yields the result that for practical bend radii (2 to 10 cm) the optimum ratio of the spin rate to the intrinsic beat length is between 4 and 6. Minimum degradation of the circular polarization holding capability is achieved when the ratio is between 3 and 8. By choosing a fiber with a spin rate in this range, the circular polarization state of the fiber can be maintained for a long length of fiber allowing for the sensitivity of the sensor to be greatly increased.

Eigen vectors, $v_{\pm}$, represent those polarization states that repeat after each period 32 along the distance l 34 of the periodic structure 31 of fiber 30. By launching the interfering waves into the exact eigen vector polarization states of the sensing fiber, slow period 32 of the polarization state evolution is nulled. Substantially matching the launched polarization state to the eigen vectors of the periodic structure of the sensing fiber constitutes a first method of overcoming slow or long undulations 32. For the in-line 25 and Sagnac 24 type current sensors which use spun-birefringent sensing fiber 30, one may change a (nominal) quarter waveplate 33 slightly such that the light that is launched into the sensing fiber is of that polarization state that maintains itself upon propagation along the sensing fiber. That is, for a quarter waveplate 33 having a length of 3 cm and angle of 45 degrees, a slightly changed quarter waveplate 33 would be at 2.8 cm and 42 degrees, to avoid long undulation. For the bent-spun fiber, this "eigen polarization state" is equal to that state which repeats itself after propagating a distance corresponding to one complete revolution of fiber twist.

Figure 10:
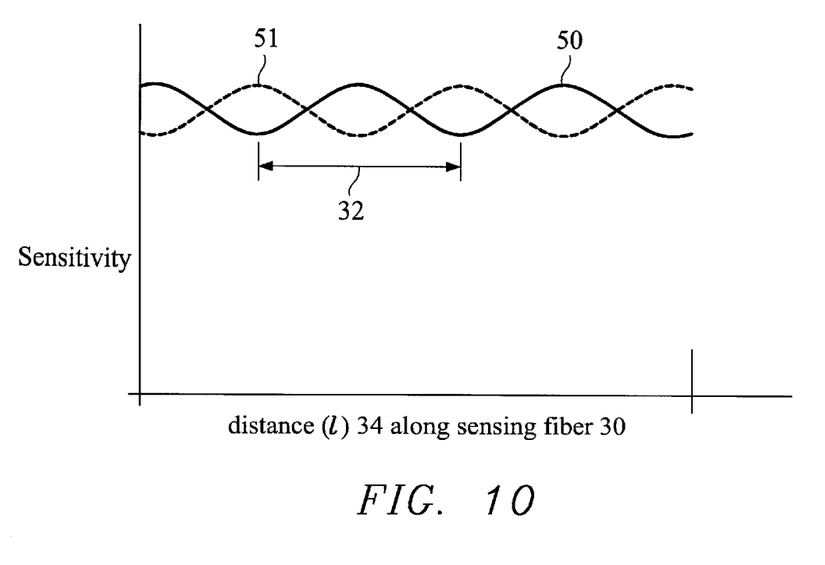
FIG. 10 shows the direction dependent sensitivity along the sensing coil for a Sagnac loop type fiber optic current sensor having an optimal length of sensing fiber.
Figure 11:
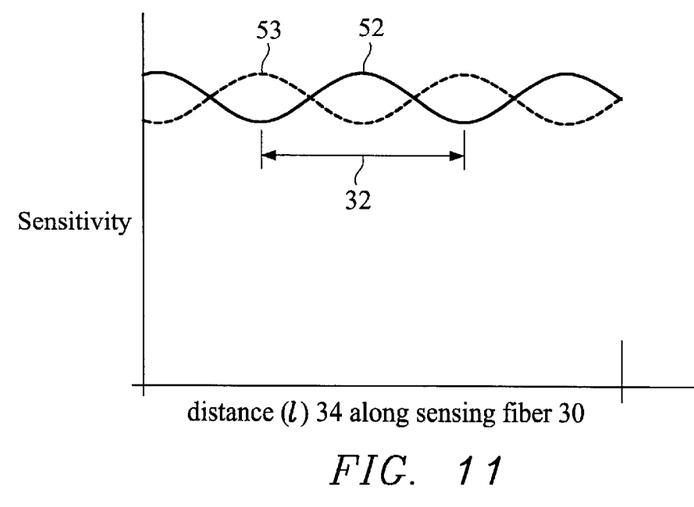
FIG. 11 shows the direction dependent sensitivity of the sensing coil for an in-line interferometric type fiber current sensor having an optimal length of sensing fiber.

A second method for overcoming this slow undulation 32 in the fiber sensitivity to magnetic fields 27 is to cut the overall length of the sensing fiber 30 to a proper length l 34. For a double-pass device using a reflective termination 48 such as a in-line type 25 sensor head 28, this proper length is Mξ/4, where M is an odd integer. For the Sagnac loop type sensor 24, a proper length 31 is Mξ/2, where M is an odd integer. These length 31 choices cause the low-order variation of the magnetic field sensitivity as seen by the light traveling in one direction to be cancelled by the light traveling in the opposite direction. FIGS. 10 and 11 show the direction dependent local sensitivities of the sensing fiber 30 to magnetic field for the Sagnac and in-line sensors, respectively.

FIG. 10 shows the magnetic field sensitivity versus distance 34 (l) along fiber 30 of sensing coil 28 for Sagnac loop interferometric type fiber optic current sensor 24, having an optimal fiber 30 length, $L_{total}$. $L_{total}$ is equal to Mξ/2 where M is an odd integer and ξ is the length of long period undulation 32. Curve 50 shows the sensitivity in the first direction of fiber 30 of coil 28. Curve 51 shows the sensitivity in the second direction of fiber 30. The effects of these sensitivities cancel each other.

FIG. 11 shows the magnetic field sensitivity versus distance 34 (l), along fiber 30 of sensing coil 28 for in-line interferometric type fiber optic current sensor 25, having an optimal fiber 30 length, $L_{total}$. $L_{total}$ is equal to Mξ/4, where M is an odd integer and ξ is the length of long period undulation 32. Curve 52 shows the sensitivity in the first direction of fiber 30 in sensing head 28. Curve 53 shows the sensitivity in the second direction of fiber 30. The effects of these sensitivities cancel each other.

A third method for canceling this slowly varying sensitivity is to form a sensing coil 28 using multiple turns of sensing fiber 30 having a properly chosen perimeter length P. The perimeter of sensing coil 28 should be chosen to be such a length that the slow variations in sensitivity are averaged out over the whole sensing coil. Mathematically, this idea is developed as follows.

The local sensitivity of the sensing fiber to magnetic field along the length l 34 of fiber 30, S(l) is written as (excluding high spatial frequency variations), $$S(l) = S_0 + S_1 \cos\left(\frac{2\pi l}{\xi} + \psi\right), \quad (19)$$

where $S_0$ is the constant part or characteristic of the sensitivity, ξ is the long period of undulation in the polarization state of the light and ψ is a phase offset. $S_0$ should not be confused with $S_1$, $S_2$, etc., which represent imperfections of coil 28. When a multi-turn optical fiber sensing coil 28 is used, one desires that the sum of the local sensitivities at each point at length l along the fiber length 34 in the sensing coil 28 accumulate to a constant. Thus, one requires that $$\sum_{n=1}^{N-1} \cos\left(\frac{2\pi l + nP}{\xi}\right) + \psi = 0, \text{ for all } l, \quad (20)$$

where P is a perimeter length around the sensing coil and not the length of the sensing fiber, N is the total number of turns of fiber comprising sensing coil 28, and n is the index of summation for all fibers at that point of nP. l is a distance along the length of the fiber. $S_n$ represents the imperfections of coil 28. Ideally, $S_n$ should be zero. Besides $S_0$, only $S_1$ and $S_2$ are of most concern. $S_3$, $S_4$ and so forth are generally insignificant. The varying sensitivity around a perimeter of sensing coil 28 may be stated as $$S_o + \sum_{n=1}^{\infty} S_n \cos\left(\frac{2n\pi z'}{P} + \varphi_n\right), \quad (21)$$

where z' is a distance along the perimeter P of sensing coil 28, and $\psi_n$'s are constants. $S_1$ and $S_2$ are typically less than $S_0 \cdot 10^{-3}$.

The requirement of equation (20) can be simplified to yield, $$\frac{\sin\left(\frac{\pi NP}{\xi}\right)}{\sin\left(\frac{\pi P}{\xi}\right)} = 0, \quad (22)$$

or $$P = \frac{m\xi}{N}, \quad (23)$$

where m=odd integer, excluding m=kN, k=any integer. Thus, by choosing the perimeter of sensor coil 28 to substantially meet the requirement imposed by equation (23), the overall sensitivity variation having a period ξ is canceled over the entire sensing coil.

A fourth method for overcoming the deleterious effects on isolation and uniformity performance of a slow undulation 32 in the magnetic field 27 sensitivity is to use a long length l 34 of sensing fiber 30 in combination with a multi-wavelength, or broad band light source 35. The periods of slow undulations 32 in the sensing fiber 30 are typically wavelength dependent. For the bent-spun fiber 30, the period of slow undulation 32 is proportional to wavelength squared. By employing a light source 35 with multiple wavelengths, the corresponding multiple periods of god sensitivity will eventually cause the sensitivity to average to a constant after a long distance 34 (l) of sensing fiber 30. For fiber sensor coil 28 lengths greater than the slow undulation period 32 divided by the fractional bandwidth of light source 35, significant averaging of the slow undulation will occur. Mathematically, this condition is expressed as $$L_{total} > \frac{\xi \lambda}{\Delta \lambda}, \quad (24)$$

where $L_{total}$ is the total length 34 of sensing fiber 30, λ is the mean source 28 wavelength, and Δλ is the wavelength spread of the source. Typically, $L_{total}$ would need to exceed several tens of meters for this technique to yield significant results.

These four methods for overcoming the deleterious effects on isolation and uniformity performance of a slow undulation 32 in the fiber 30 sensitivity to magnetic field 27 are complementary. They may be implemented either separately, or in any combination.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A magnetic field integrating optical sensor comprising:
    a sensor head having a varying sensitivity of period ξ around its perimeter of the form $$S_o + \sum_{n=1}^{\infty} S_n \cos\left(\frac{2n\pi z'}{P} + \Psi_n\right);$$

and wherein:
    $S_o$ is a sensitivity constant of said sensor head;
    $S_n$ is an imperfection constant of said sensor head for $n \geq 1$;
    z' is a distance along the perimeter of said sensor head;
    P is a length of the perimeter equal to $$\frac{m \cdot \xi}{N},$$

where m is an odd integer not equal to kN; k is any integer; and N is a number of sensing fiber turns contained in the sensor head; and
    $\Psi_n$'s are constants.

2. The sensor of claim 1, wherein $S_1 < S_0 \cdot 10^{-3}$.

3. The sensor of claim 2, wherein said sensor head comprises a fiber-optic sensing coil.

4. The sensor of claim 2, wherein said optical sensor is a current sensor.

5. The sensor of claim 2, wherein said optical sensor is a voltage sensor.

6. The sensor of claim 3, wherein said fiber-optic sensing coil comprises a fiber having a periodic structure.

7. The sensor of claim 6, wherein the fiber having a periodic structure is a spun birefringent fiber.

8. A magnetic field integrating optical sensor comprising:
    a fiber-optic sensing coil formed from a spun birefringent fiber having a periodic structure, the fiber-optic sensing coil having a varying sensitivity around its perimeter of the form $$S_o + \sum_{n=1}^{\infty} S_n \cos\left(\frac{2n\pi z'}{P} + \Psi_n\right);$$

wherein:
    $S_o$ is a sensitivity constant of said sensor head;
    $S_n$ is an imperfection constant of said sensor head for $n \geq 1$;
    z' is a distance along the perimeter of said sensor head;
    P is a length of the perimeter; and
    the $\Psi_n$'s are constants; and wherein the spun birefringent fiber has a long spatial period, ξ, approximately equal to $$4 \cdot \frac{L_B^2}{L_{rev}},$$

where $L_B$ is the intrinsic polarization beat length of the spun birefringent fiber in its unspun state, and $L_{rev}$ is the length of each period in the periodic structure of the spun birefringent fiber.

9. The sensor of claim 8, wherein $S_2 < S_0 \cdot 10^{-3}$.

10. The sensor of claim 9, wherein said optical sensor is a current sensor.

11. The sensor of claim 9, wherein said optical sensor is a voltage sensor.

12. A magnetic field integrating fiber optic sensor comprising:
    a sensor head having fiber that exhibits a periodic undulation in sensitivity;
    a light source that emits multiple wavelengths; and
    a total fiber length greater than the ratio of the undulation period to the fractional light source spectral bandwidth such that $$L_{TOTAL} = \left(\frac{\xi \cdot \lambda}{\Delta\lambda}\right);$$

wherein $L_{TOTAL}$ is the total length of the fiber, λ is the mean source wavelength, and Δλ is the wavelength spread of the source.

13. The sensor of claim 12, wherein said fiber optic sensor is a current sensor.

14. The sensor of claim 12, wherein said fiber optic sensor is a voltage sensor.

15. A magnetic field integrating fiber optic sensor comprising:
    a sensor head having a fiber with a periodic structure; and
    a means for launching at least one light wave into the fiber having a polarization state that substantially replicates itself after each period of the periodic structure.

16. The sensor of claim 15, wherein the said fiber optic sensor is a current sensor.

17. The sensor of claim 15, wherein the said fiber optic sensor is a voltage sensor.

18. The sensor of claim 15, wherein the fiber having a periodic structure is a spun birefringent fiber.

19. A magnetic field integrating fiber optic sensor comprising:
    a sensor head having a fiber that exhibits a periodic undulation in sensitivity; and
    wherein the fiber has a total length substantially equal to an odd integer times a quarter-period of the undulation.

20. The sensor of claim 19, wherein said fiber optic sensor is a current sensor.

21. The sensor of claim 19, wherein said fiber optic sensor is a voltage sensor.

22. The sensor of claim 19, wherein said fiber optic sensor is an in-line interferometric sensor.

23. A magnetic field integrating fiber optic sensor comprising:
    a sensor head having a fiber that exhibits a periodic undulation in sensitivity; and
    the fiber has a total length substantially equal to an odd integer times a half-period of the undulation.

24. The sensor of claim 23, wherein said fiber optic sensor is a current sensor.

25. The sensor of claim 23, wherein said fiber optic sensor is a voltage sensor.

26. The sensor of claim 23, wherein said fiber optic sensor is a Sagnac loop type sensor.

27. A magnetic field integrating fiber optic sensor comprising:
   a sensor head having a fiber that exhibits a periodic undulation in sensitivity of period $\xi$; and wherein:
      a relationship is between the undulation period and a perimeter length P of said sensor head;

$$P = \frac{m\xi}{N};$$

m is an odd integer not equal to kN;
   k is any integer; and
   N is a number of sensing fiber turns contained in the sensor head.

28. The sensor of claim 27, wherein said fiber optic sensor is a current sensor.

29. The sensor of claim 27, wherein said fiber optic sensor is a voltage sensor.

30. The sensor of claim 27, wherein said sensing fiber is a spun birefringent fiber.

31. A magnetic field integrating optical sensor comprising:
   a fiber-optic sensing coil formed from a spun birefringent fiber having a periodic structure, the fiber-optic sensing coil having a varying sensitivity around its perimeter;
   wherein the spun birefringent fiber has a long spatial period, $\xi$, approximately equal to $$4 \cdot \frac{L_B^2}{L_{rev}},$$

where $L_B$ is the intrinsic polarization beat length of the spun birefringent fiber in its unspun state, and $L_{rev}$ is the length of each period in the periodic structure of the spun birefringent fiber; and
   wherein a ratio of $L_{rev}$ to $L_B$ is between three and eight.

32. The optical sensor of claim 31, wherein the ratio of $L_{rev}$ to $L_B$ is between four and six.

* * * * *

UNITED STATES PATENT AND TRADEMARK OFFICE
CERTIFICATE OF CORRECTION

PATENT NO. : 6,307,632 B1
DATED : October 23, 2001
INVENTOR(S) : James N. Blake

It is certified that error appears in the above-identified patent and that said Letters Patent is hereby corrected as shown below:

Column 1,
Line 19, delete "NH θ $dl$ = I", and insert -- $_v$H A $dl$ = I --.

Column 3,
Line 14, after "$I_{sensed}$ =", delete "N S (z) H Adz,", and insert -- $_v$S (z) H dz, --.
Line 31, that portion of the formula that reads:

$$dy = \frac{1}{2}(dz - dz^*),$$ should read -- $$dy = \frac{1}{2i}(dz - dz^*),$$ --.

Column 6,
Line 67, after "distance", delete " 1 ", and insert -- $\ell$ --.

Column 7
Line 21, after "length", delete " 1 ", and insert -- $\ell$ --.

Lines 33 and 43, after "34", delete " (1) ", and insert -- ($\ell$) --.

Line 58, after "length", delete " 1 ", and insert -- $\ell$ --.

Lines 58 and 62, after "S", delete " 1 ", and insert -- $\ell$ --.

Line 62, that portion of the formula that reads:

$$S(l) = S_0 + S_1 Cos\left(\frac{2\pi l}{\xi} + \psi\right)$$ should read -- $$S(\ell) = S_0 + S_1 Cos\left(\frac{2\pi \ell}{\xi} + \psi\right),$$ --.

UNITED STATES PATENT AND TRADEMARK OFFICE
CERTIFICATE OF CORRECTION

PATENT NO. : 6,307,632 B1
DATED : October 23, 2001
INVENTOR(S) : James N. Blake

It is certified that error appears in the above-identified patent and that said Letters Patent is hereby corrected as shown below:

Column 8,
Line 4, after "length", delete " 1 ", and insert -- $\ell$ --.

Line 9, that portion of the formula that reads: $\left(\dfrac{2\pi l + nP}{\xi}\right)$ should read -- $\left(\dfrac{2\pi\ell + nP}{\xi}\right)$ --.

Line 9, after "all", delete " 1 ", and insert -- $\ell$ --.

Line 21, that portion of the formula that reads: $\left(\dfrac{2n\pi z'}{P} + \varphi_n\right)$, should read -- $\left(\dfrac{2n\pi z'}{P} + \varphi_n\right)$ --.

Line 49, delete " 1 ", and insert -- $\ell$ --.

Line 54, after "of", delete " god ".
Line 57, after "34", delete "(1)", and insert -- $\ell$ --.

Signed and Sealed this

Seventh Day of May, 2002

Attest:

JAMES E. ROGAN
Director of the United States Patent and Trademark Office

*Attesting Officer*